United States Patent
Li et al.

(10) Patent No.: US 7,633,108 B2
(45) Date of Patent: Dec. 15, 2009

(54) METAL/SEMICONDUCTOR/METAL CURRENT LIMITER

(75) Inventors: Tingkai Li, Vancouver, WA (US); Sheng Teng Hsu, Camas, WA (US); Wei-Wei Zhuang, Vancouver, WA (US); David R. Evans, Beaverton, OR (US)

(73) Assignee: Sharp Laboratories of America, Inc., Camas, WA (US)

(*) Notice: Subject to any disclaimer, the term of this patent is extended or adjusted under 35 U.S.C. 154(b) by 188 days.

(21) Appl. No.: 11/893,402

(22) Filed: Aug. 15, 2007

(65) Prior Publication Data

US 2007/0284575 A1    Dec. 13, 2007

Related U.S. Application Data

(60) Division of application No. 11/216,398, filed on Aug. 31, 2005, now Pat. No. 7,271,081, which is a continuation-in-part of application No. 11/184,660, filed on Jul. 18, 2005, now Pat. No. 7,303,971.

(51) Int. Cl.
*H01L 27/108*  (2006.01)
*H01L 29/76*   (2006.01)
*H01L 29/94*   (2006.01)
*H01L 31/119*  (2006.01)

(52) U.S. Cl. .......... 257/296; 257/288; 257/E21.17; 257/E21.267; 257/E21.319; 257/E21.324; 257/E21.645

(58) Field of Classification Search .......... 257/296, 257/288, 309, 310, 311, 312
See application file for complete search history.

(56) References Cited

U.S. PATENT DOCUMENTS

| | | | |
|---|---|---|---|
| 6,331,944 B1 * | 12/2001 | Monsma et al. | 365/171 |
| 6,753,561 B1 * | 6/2004 | Rinerson et al. | 257/295 |
| 7,271,081 B2 * | 9/2007 | Li et al. | 438/570 |
| 7,303,971 B2 * | 12/2007 | Hsu et al. | 438/381 |
| 7,446,010 B2 * | 11/2008 | Li et al. | 438/328 |

* cited by examiner

*Primary Examiner*—David Nhu
(74) *Attorney, Agent, or Firm*—Law Office of Gerald Maliszewski; Gerald Maliszweski

(57) ABSTRACT

A method is provided for forming a metal/semiconductor/metal (MSM) current limiter and resistance memory cell with an MSM current limiter. The method provides a substrate; forms an MSM bottom electrode overlying the substrate; forms a ZnOx semiconductor layer overlying the MSM bottom electrode, where x is in the range between about 1 and about 2, inclusive; and, forms an MSM top electrode overlying the semiconductor layer. The ZnOx semiconductor can be formed through a number of different processes such as spin-coating, direct current (DC) sputtering, radio frequency (RF) sputtering, metalorganic chemical vapor deposition (MOCVD), or atomic layer deposition (ALD).

7 Claims, 8 Drawing Sheets

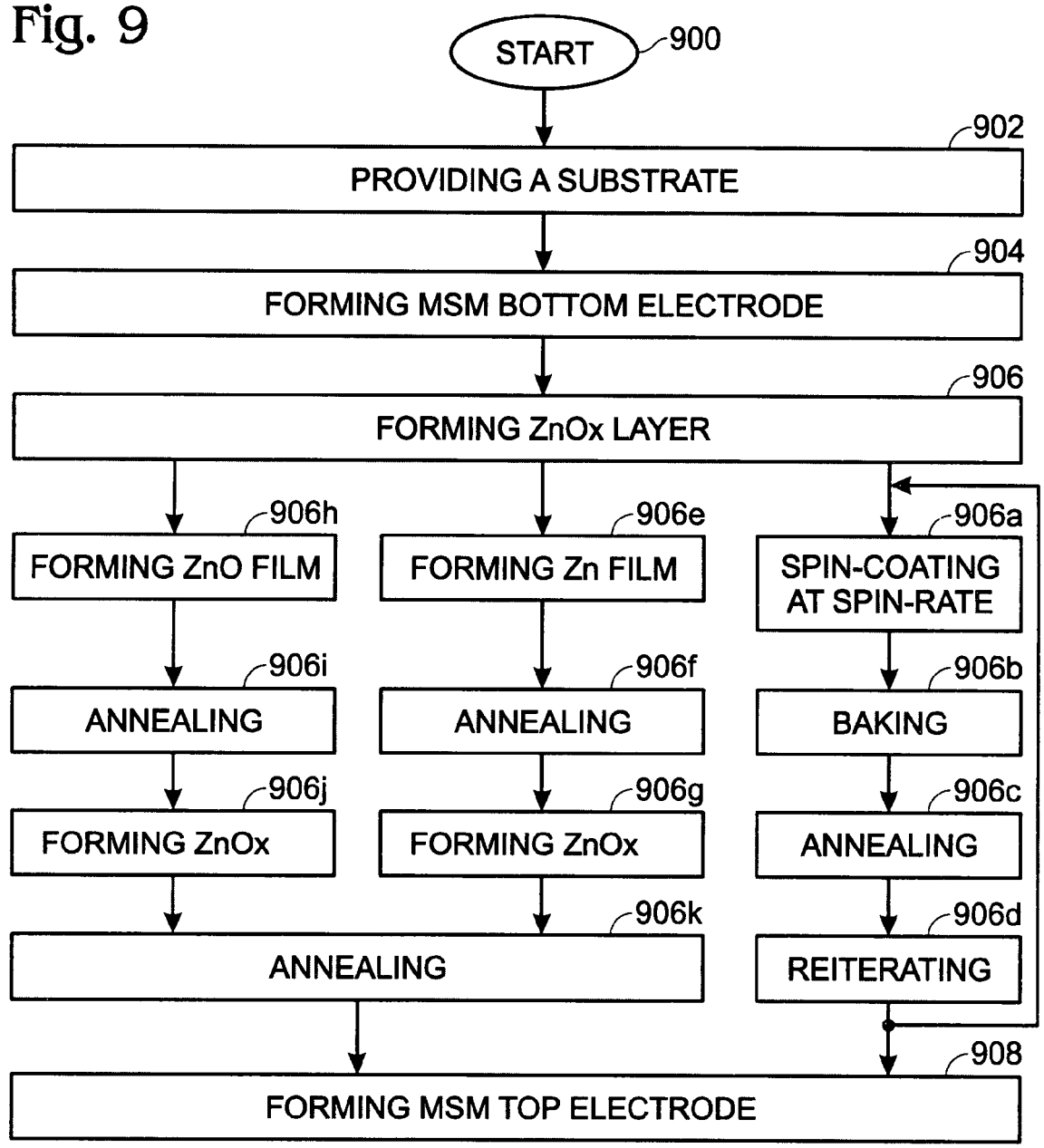

METAL/SEMICONDUCTOR/METAL CURRENT LIMITER

RELATED APPLICATIONS

This application is a Divisional of a patent application entitled, METAL/ZnOx/METAL CURRENT LIMITER, invented by Tingkai Li et al., Ser. No. 11/216,398, filed Aug. 31, 2005, and issued as U.S. Pat. No. 7,271,081;

which is a Continuation-in-Part of a patent application entitled, MSM BINARY SWITCH MEMORY DEVICE, invented by Sheng Teng Hsu et al., Ser. No. 11/184,660, filed Jul. 18, 2005, and issued as U.S. Pat. No. 7,303,971. Both applications are incorporated herein by reference.

BACKGROUND OF THE INVENTION

1. Field of the Invention

This invention generally relates to an integrated circuit (IC) fabrication process and, more particularly, to a metal/ZnOx/metal current limiter device and associated fabrication processes.

2. Description of the Related Art

A cross-point memory array is a matrix of memory elements, with electrical contacts arranged along x-axes (i.e., word lines) and along y-axes (i.e., bit lines). In some aspects, a digital value is stored as a memory resistance (high or low). The memory state of a memory cell can be read by supplying a voltage to the word line connected to the selected memory element. The resistance or memory state can be read as an output voltage of the bit line connected to the selected memory cell.

Cross-point resistor memory arrays are prone to read disturbance problems. As part of the read operation, electric current flows from a selected word line, through a selected memory cell, to a bit line. However, current also flows into unselected word lines that happen to cross over the selected bit line. The conduction of current into unselected word lines acts to decrease the output impedance and, hence, reduce the output voltage. To clearly distinguish memory states, the output voltage must be clearly distinguishable.

The undesired flow of current through a resistance memory cell can be addressed through the use of series-connected diodes, since reverse biased diodes are poor conductors. However, this same feature makes a one-diode/one resistor (1D1R) memory difficult to program. Programming voltages cannot be used that reverse bias the diode. Therefore, 1D1R cells are better for suited for unipolar programming. Further, diodes are preferable formed from single crystal silicon, for optimal performance. However, large crystal grains are difficult to form using thin-film deposition processes.

Many cross-point resistor memory array structures have been proposed in attempts to minimize cross-talk problems during read operations in a large area cross-point resistor memory array. IRID memory cell are well suited for a monopolarity programming memory array. However, good diodes can only be fabricated on single crystal silicon. For multilayer three-dimensional arrays, the upper layer of a diode is formed by re-crystallization of deposited silicon, and the resulting diode usually exhibits poor electrical properties. In addition, the diode must be formed from a silicon film that is fairly thick.

Rinerson et al., U.S. Pat. No. 6,753,561, have proposed a memory cell of a metal/insulator/metal (MIM) structure in series with a resistor memory. The MIM device is non-conductive at low biases. When the bias voltage is higher than a certain value, the conductivity drastically increases. This voltage is called either the "current rise-up voltage" or "varistor voltage". The high field generated in response to the MIM high current region is associated with impact ionization. As a result, the current voltage characteristics are reversible only at relatively low current conditions. The MIM device is unable to handle a large current density. In addition, Rinerson does not teach specific MIM materials, or how a MIM device is fabricated.

SUMMARY OF THE INVENTION

Described herein is a current limiting device that permits current flow in both forward and reverse directions under higher voltage (forward and reverse) bias conditions, but blocks current in under lower voltage bias conditions. The current limiter can be added to a resistance memory cell, to permit high voltage bipolar programming, without the penalty of flowing current into unselected word lines during lower voltage read operations.

Many conventional cross-point resistor memory arrays suffer from read disturbance problems, as electric current flows from a selected word line, through a selected memory cell to a bit line, and then into unselected word lines which cross over the bit line. A cross-point array made with a current limiter in the memory cells minimizes the current flow into the unselected word lines, maximizing the output (read) voltage.

More specifically, a metal/semiconductor/metal (MSM) current limiter is inserted into each resistor memory cell, where the semiconductor is ZnOx. The current limiter is highly conductive when it is biased with a large bias voltage, and is poor conductive when it is biased with a small voltage. The high resistance under a low voltage reverse bias conditions minimizes the selected bit line current flows into the unselected word lines, which preserves the bit output signal quality.

Accordingly, a method is provided for forming a MSM current limiter. The method comprises: providing a substrate; forming an MSM bottom electrode overlying the substrate; forming a ZnOx semiconductor layer overlying the MSM bottom electrode, where x is in the range between about 1 and about 2, inclusive; and, forming an MSM top electrode overlying the semiconductor layer. The ZnOx semiconductor can be formed through a number of different processes such as spin-coating, direct current (DC) sputtering, radio frequency (RF) sputtering, metalorganic chemical vapor deposition (MOCVD), or atomic layer deposition (ALD).

For example, if the ZnOx is formed using the spin-coating method, then a ZnOx precursor is prepared as follows: preparing a solution of 2-methyloxyethanol and ethanolamine; dissolving zinc acetate dehydrate in the solution; refluxing the solution at a temperature in the range of about 110 to 150° C., for a time duration in the range of about 20 to 60 minutes; and, filtering the solution to remove particles larger than about 0.2 micrometers.

The ZnOx is deposited at a spin-rate in the range of about 1000 to 4000 revolutions per minute (RPM), baked, and then annealed in an atmosphere such as dry air, an insert gas (e.g., $N_2$ or Ar) with an oxygen partial pressure, or pure oxygen. The process may be reiterated to form a number of ZnOx layers in the range between about 2 and 20, inclusive. Additional details of the spin-coating process, and the other ZnOx deposition processes are presented below.

A method for forming a resistance memory device with metal/semiconductor/metal (MSM) current limiter is also provided. The method comprises: forming a memory resistor bottom electrode; forming a memory resistor material overlying the memory resistor bottom electrode; forming a memory resistor top electrode overlying the memory resistor material; and, forming an MSM current limiter, as described above, overlying the memory resistor top electrode.

Additional details of the above-described current limiter and resistance memory current limiter device are provided below.

BRIEF DESCRIPTION OF THE DRAWINGS

FIG. 9 is a flowchart illustrating a method for forming a MSM current limiter.

DETAILED DESCRIPTION

Figure 1:
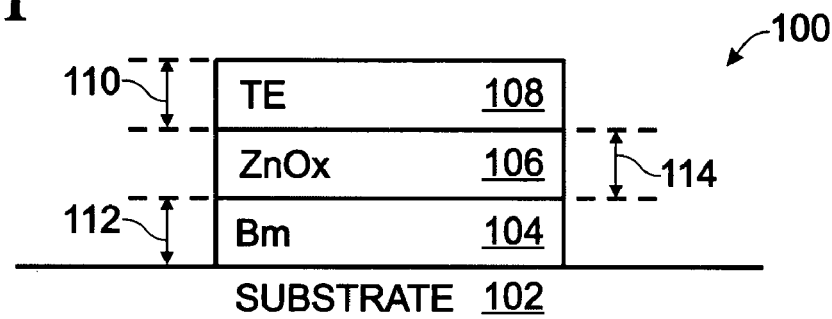
FIG. 1 is a partial cross-sectional view of a metal/semiconductor/metal (MSM) current limiter.

FIG. 1 is a partial cross-sectional view of a metal/semiconductor/metal (MSM) current limiter. The MSM current limiter 100 comprises a substrate 102 and an MSM bottom electrode (BM) 104 overlying the substrate 102. The substrate 102 is not limited to any particular material, and may be a material such as Si, Ge, GeAs, glass, quartz, or plastic. A ZnOx semiconductor layer 106 overlies the MSM bottom electrode 104, where x is in the range between about 1 and about 2, inclusive. That is, the semiconductor layer may be ZnO, $ZnO_2$, or a material where the value of x is somewhere between about 1 and about 2, inclusive. An MSM top electrode (TE) 108 overlies the semiconductor layer 106.

The value of x in the term ZnOx is associated with threshold and breakdown voltages, and subthreshold swing and current density. In general, with increasing values of x, the threshold voltage, breakdown voltage, and subthreshold swing increase, but the current density decreases. On the other hand, the ZnOx film thickness also has an effect on the threshold and breakdown voltages, as well as the subthreshold swing and current density. Therefore, the optimum properties of particular MSM devices can be obtaining by adjusting the value of x in combination with the film thickness. For this reason, it is difficult to specify a particular value of x for all circumstances.

The MSM top electrode 108 and bottom electrode 104 may be a material such as Pt, Ir, Au, Ag, TiN, Ti, Al, AlCu, Pd, Rh, W, Cr, or conductive oxides. Note, the top electrode 108 and the bottom electrode 104 need not necessarily be the same material. Typically, the MSM top and bottom electrodes 108/104 each have a thickness 110 and 112, respectively, in the range of about 30 to 200 nanometers (nm). Note, the top electrode 108 and the bottom electrode 104 thicknesses 110/112 need not necessarily be the same.

In some aspects, the ZnOx semiconductor layer 106 has a C-axis orientation. In other aspects, the ZnOx semiconductor layer 106 has a thickness 114 in the range of about 10 to 1000 nanometers.

Figure 2:
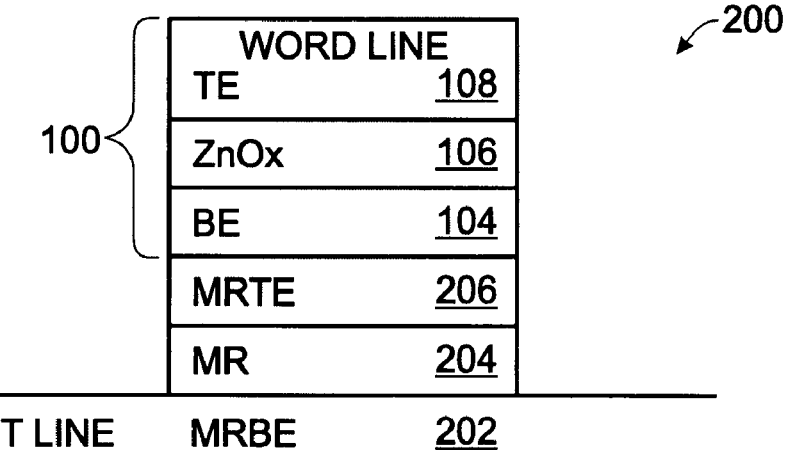
FIG. 2 is a partial cross-sectional view of a resistance memory device with a MSM current limiter.

FIG. 2 is a partial cross-sectional view of a resistance memory device with a MSM current limiter. The device 200 comprises a memory resistor (MR) bottom electrode (bit line) 202, a memory resistor material 204 overlying the memory resistor bottom electrode 202, and a memory resistor top electrode 206 overlying the memory resistor material 204. An MSM current limiter 100 overlies the memory resistor top electrode 206. As noted above, the MSM current limiter comprises a MSM bottom electrode 104 and a ZnOx semiconductor layer 106 overlying the MSM bottom electrode 104, where x is in the range between about 1 and about 2, inclusive. An MSM top electrode (word line) 108 overlies the semiconductor layer 106. In other aspects not shown, the MSM current limiter is formed "under" the MR cell, as opposed to "over" the memory cell as shown. That is, the MSM bottom electrode 104 can be a bit line, with the memory resistor bottom electrode 202 formed overlying the MSM top electrode 108. Then, the MR top electrode 206 would be a word line.

The memory resistor material 204 may be a material such as $Pr_{0.3}Ca_{0.7}MnO_3$ (PCMO), colossal magnetoresistive (CMR) film, transition metal oxides, Mott insulators, high-temperature super conductor (HTSC), or perovskite materials. Materials such as Ag, Au, Pt, Ir, or TiN may be used as for the top electrode 206 and bottom electrode 202. Details of the current limiter 100 are provided in the explanation of FIG. 1, and are not repeated here in the interest of brevity. In a memory array, a plurality of devices 200 would be attached to each bit line and word line, as is well understood in the art.

Functional Description

Figure 3:
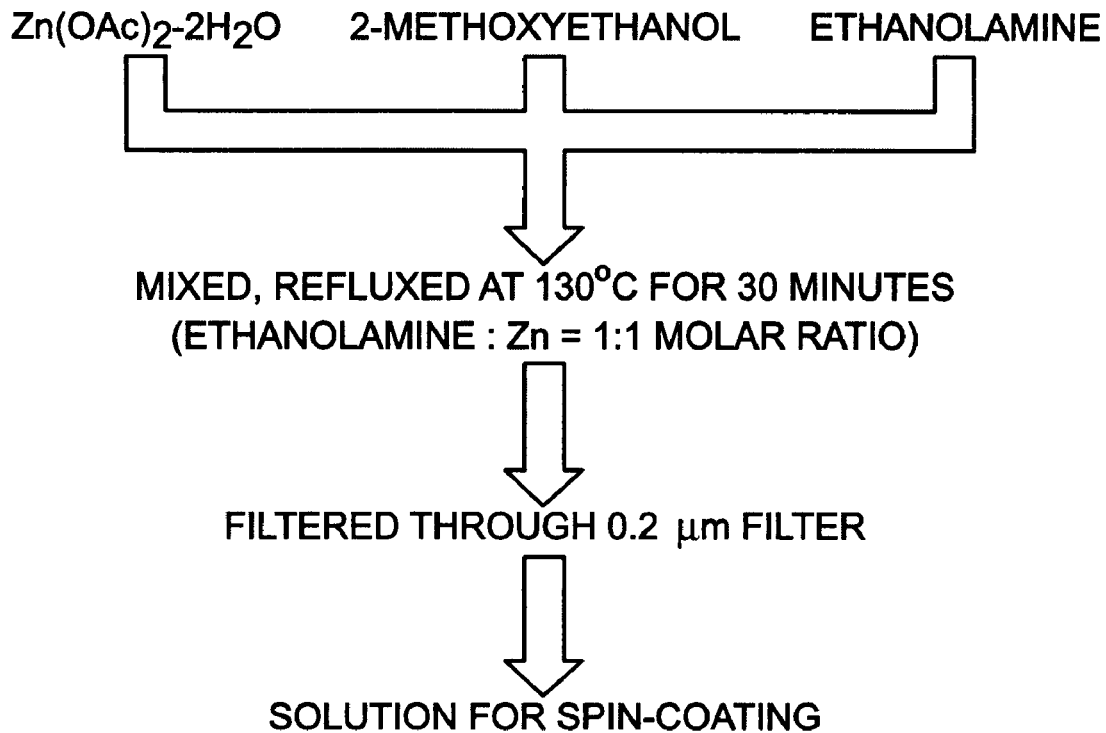
FIG. 3 is a diagram depicting a ZnOx spin-on precursor synthesis route.

FIG. 3 is a diagram depicting a ZnOx spin-on precursor synthesis route. A P-type Si (100) wafer substrate may be used. After SC1 and SC2 cleaning, and HF 20:1 dip etching, layers of about 100 nm of Pt and about 180 nm of TiN are deposited on the Si wafers. The bottom and top electrodes can be any metal such as Pt, Ir, Al, AlCu, Au, Ag, Pd, Rh, W, Ti, or Cr. The bottom and top electrodes can also be conductive oxides such as YBCO, ITO, InO3, ZnO, $RuO_2$, and $La_{1-x}Sr_xCoO_3$, or the like. A TiN/ZnO/TiN current limiter provides excellent results.

Zinc acetate dehydrate is used as the starting chemical, which is dissolved in the combined solution of 2-methoxyethanol and ethanolamine. The ethanolamine is added to promote a strong C-orientation growth of ZnOx thin films. The solution may be refluxed for about 30 minutes at about 130° C. and filtered through about a 0.2 micrometer (µm) filter. ZnOx thin films may be spin-coated at a spin-rate ranging from about 1000 to 4000 rpm, and then baked at hot plate temperatures of about 100°, about 200°, and about 300° C., respectively, for about one minute (each). Each layer may be finally RTA annealed at about 450° C. for about five minutes in oxygen ambient.

Alternately, the ZnOx may be deposited by sputtering. Some DC-sputtering ZnOx deposition conditions and annealing schemes are listed in the Tables 1 and 2. Using a Zn target, with or without oxygen, Zn or ZnO films are deposited. Then, the Zn or ZnO thin films may be annealed at about 450° C. in dry air for about 30 minutes. Finally, about 180 nm of TiN may be deposited on the ZnOx and patterned for current vs. voltage (IV) measurements.

TABLE 1

The DC sputtering process conditions of ZnOx thin films

| Target | Power (W) | Dep. Temp. | Dep. Pres. | Atmosphere | Dep. Time |
|---|---|---|---|---|---|
| Zn | 100-300 | 20-300° C. | 2-10 mTorr | Ar or N with 0-30% $O_2$ | 1-60 m |

TABLE 2

Annealing scheme for ZnOx samples

| Anneal Temp. | Time | atmosphere |
|---|---|---|
| 400-500° C. | 5-60 min | Dry air or oxygen |

Experimental Results

Figure 4:
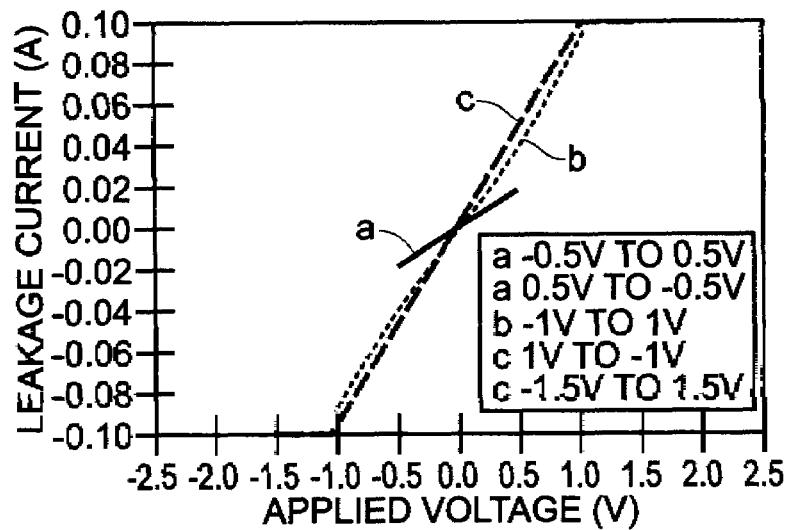
FIG. 4 shows the IV curves of MSM current limiter devices with a ZnOx thickness of about 6.9 nm.

FIG. 4 shows the IV curves of MSM current limiter devices with a ZnOx thickness of about 6.9 nm. The ZnO thickness of about 6.9 nm essentially forms a short between the electrodes. The shorting occurs because electrons find it easy to tunnel through thinner ZnOx thin films.

Figure 5A:
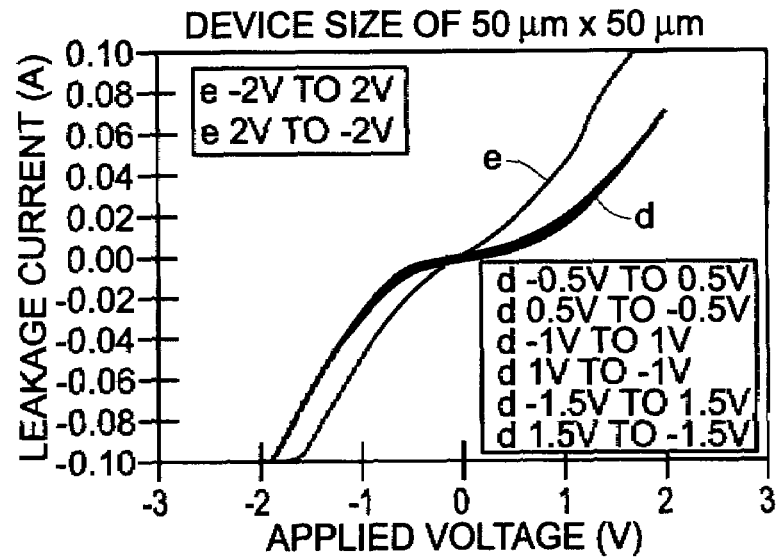
FIGS. 5A-5D and 6A-6D depict the IV curves of MSM current limiters with a thicker ZnOx thin film than the device of FIG. 4.
Figure 5B:
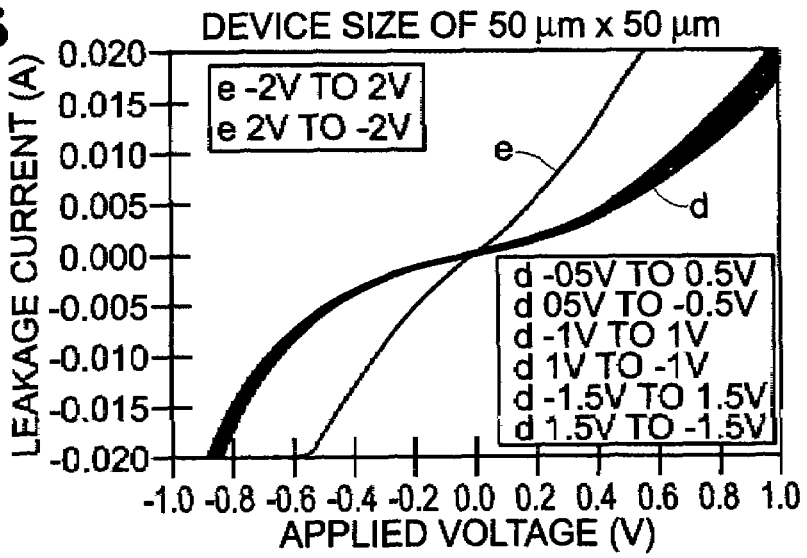
Figure 5C:
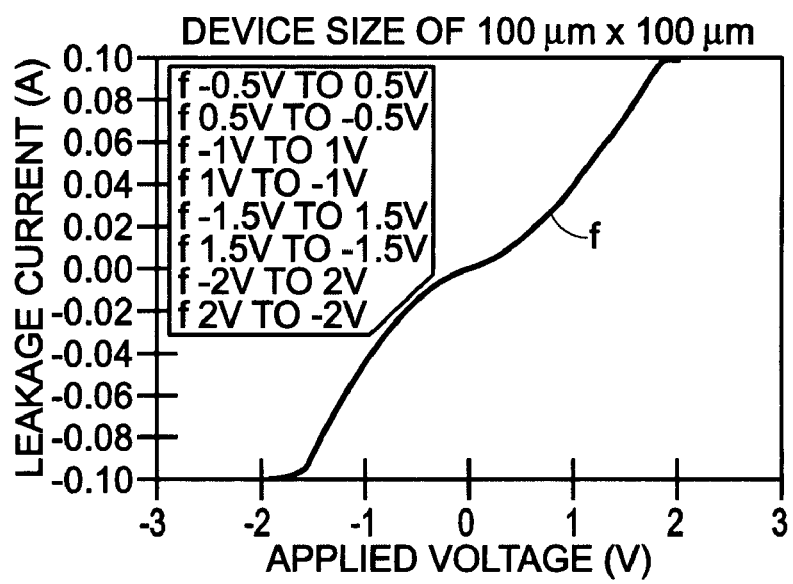
Figure 5D:
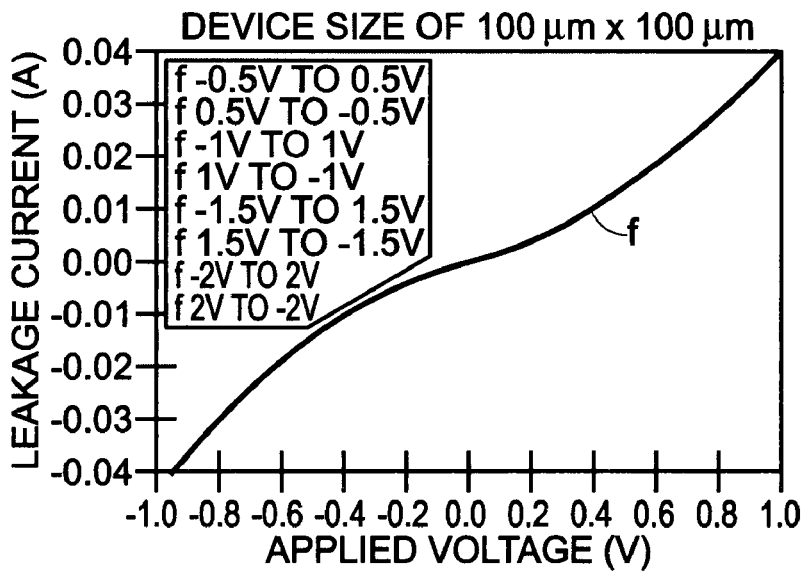
Figure 6A:
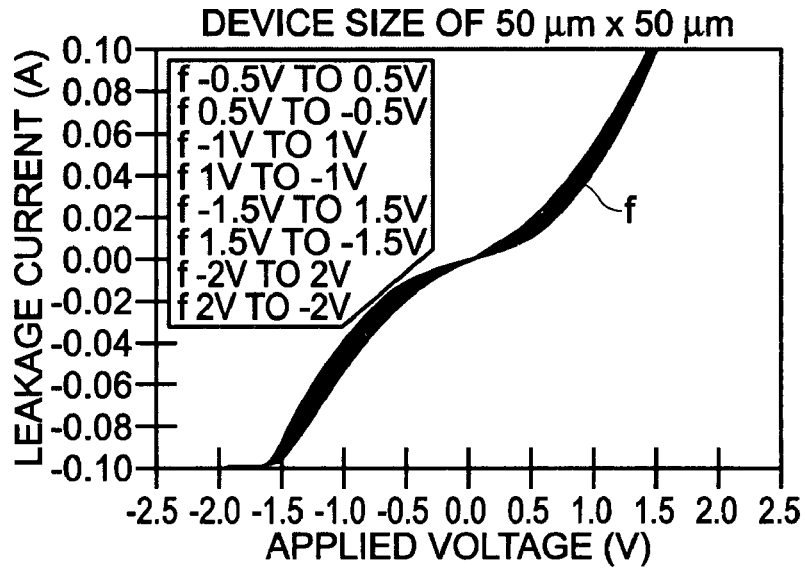
Figure 6B:
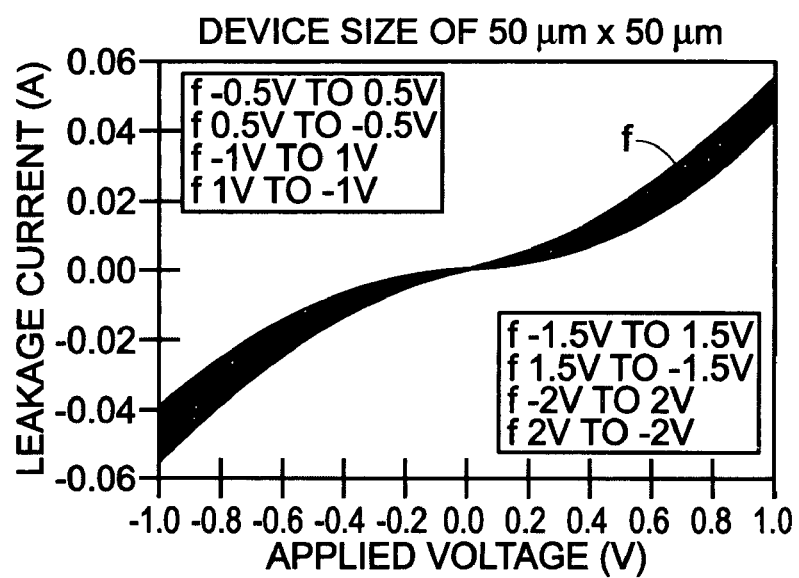
Figure 6C:
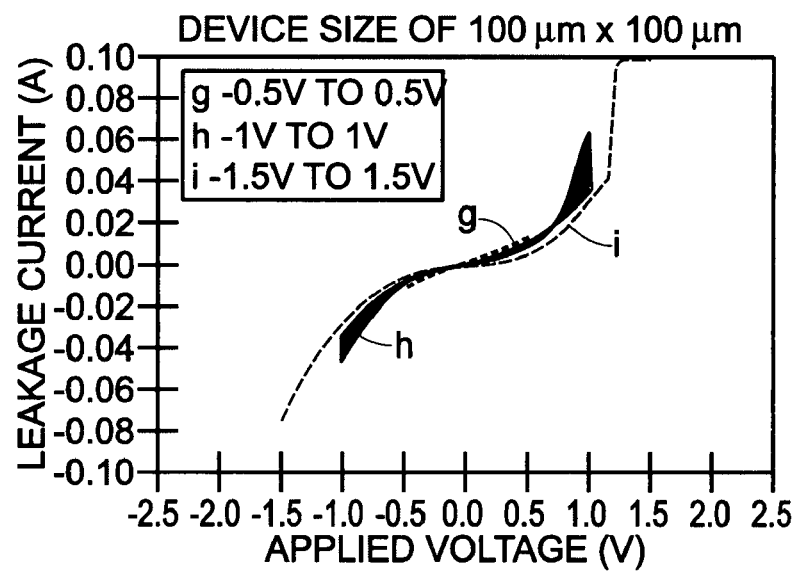
Figure 6D:
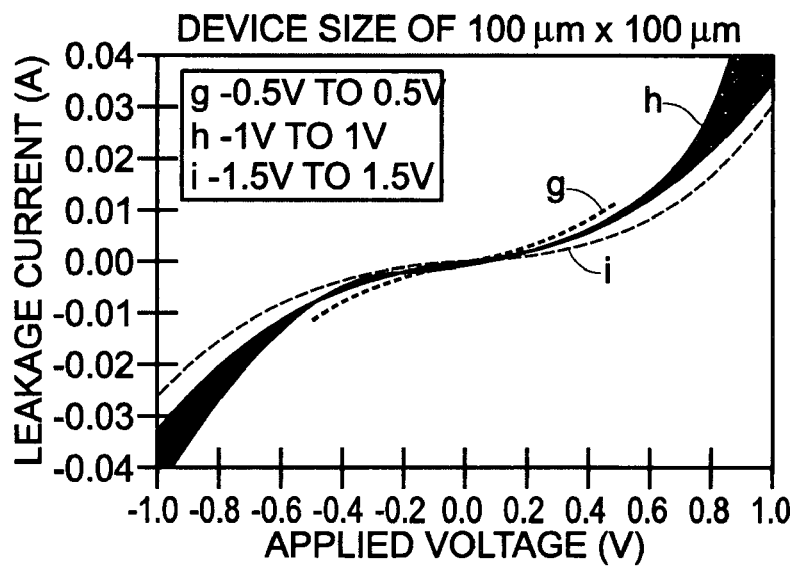
Figure 7A:
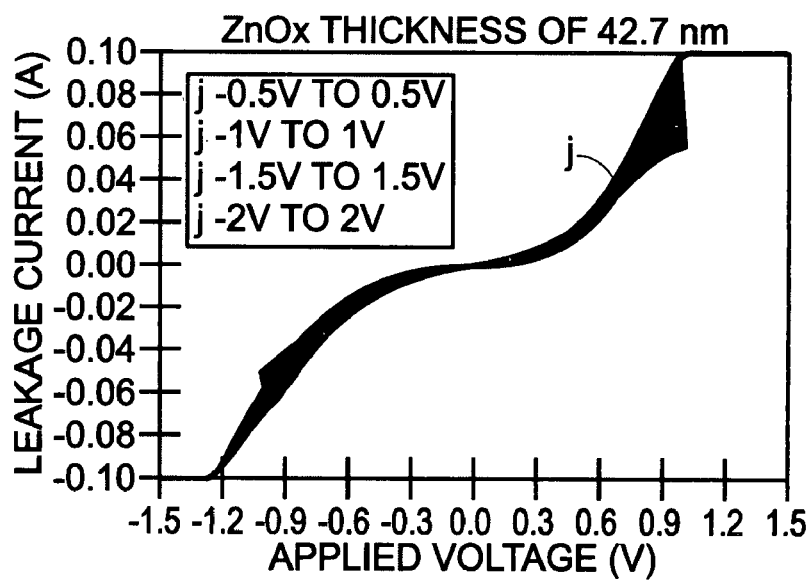
FIGS. 7A-7D depict the IV curves of MSM current limiter devices with various ZnOx thicknesses, from about 42.7 nm to 110 nm, with a device size of about 50 µm×50 µm.
Figure 7B:
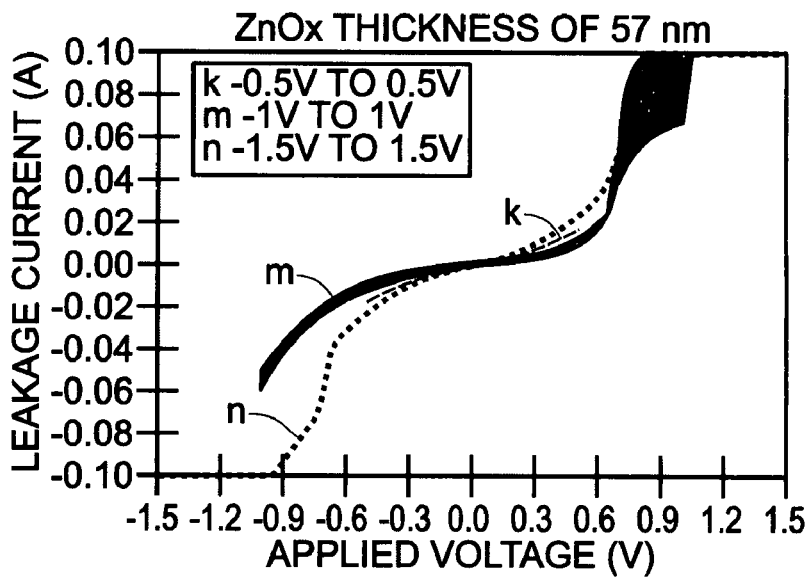
Figure 7C:
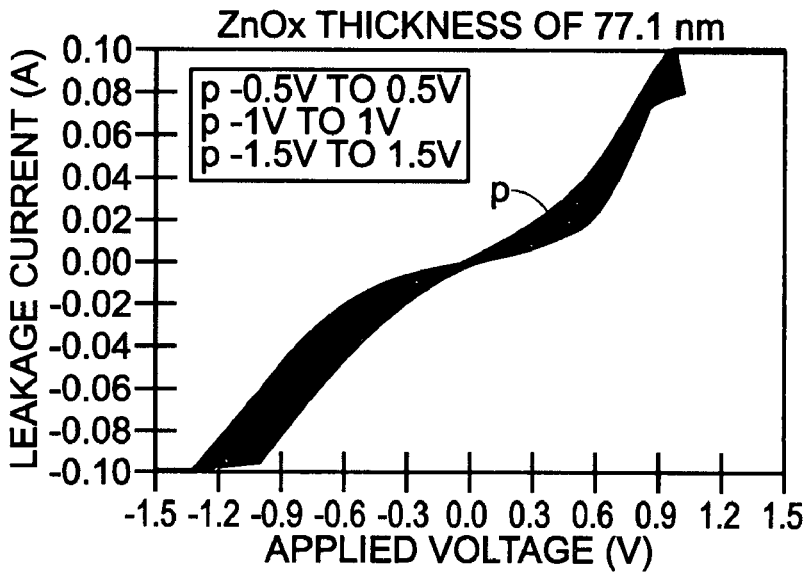
Figure 7D:
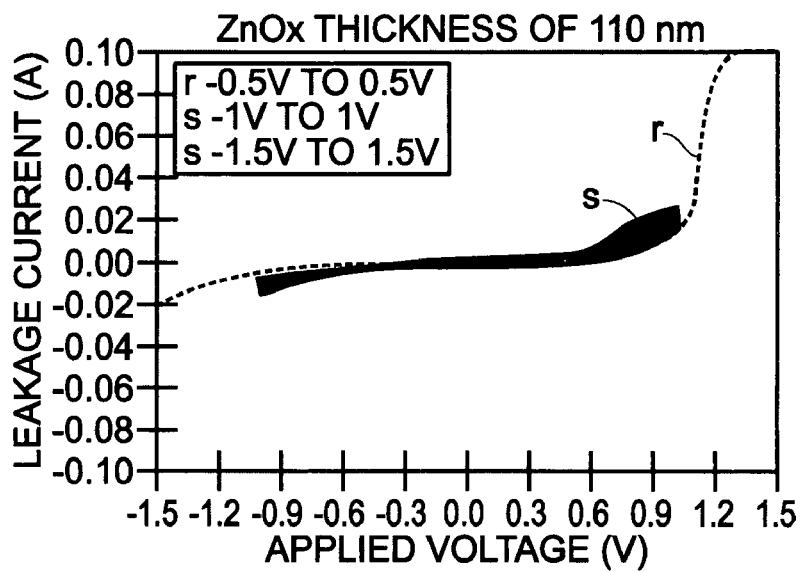

FIGS. 5A-5D and 6A-6D depict the IV curves of MSM current limiters with a thicker ZnOx thin film than the device of FIG. 4. More interesting results are obtained from MSM devices with a ZnOx thickness of about 15.7 and 18.7 nm. FIGS. 5A and 5B show the IV curves of an MSM device with a ZnOx thickness of about 15.7 nm and a device size of about 50 µm×50 µm. The threshold voltage is about 0.3V and breakdown voltage is about 2V. FIGS. 5C and 5D show the IV curves of an MSM device with ZnOx thickness of about 15.7 nm and a device size of about 100 µm×100 µm. For the MSM device of FIGS. 5C and 5D, the threshold voltage is about 0.2V and breakdown voltage is also about 2V. Of particular interest, the device shows non-linear IV characteristics at lower operation (bias) voltages.

As seen in these figures, devices with a ZnOx thickness of about 18.7 nm exhibit a behavior similar to the MSM devices with a ZnO thickness of about 15.7 nm. For both 50 µm×50 µm and 100 µm×100 µm devices, the threshold voltage is about 0.4V and breakdown voltage is about 2V. The on/off current ratio of the smaller devices (50 µm×50 µm) is better than the larger device (100 µm×100 µm).

FIGS. 7A-7D depict the IV curves of MSM current limiter devices with various ZnOx thicknesses, from about 42.7 nm to 110 nm, with a device size of about 50 µm×50 µm. Further increases in the ZnOx thickness, over about 18.7 nm up to 110 nm, result in an increase in threshold voltage, while the breakdown voltages remain about 2 to 2.5 V. The currents also decrease with an increasing ZnOx thickness, which means that the resistance of the MSM devices increases. Some devices only exhibit non-linear IV characteristics after higher voltage training, which switches devices at a high voltage, then back to lower operation voltage to measure the IV curves.

Figure 8A:
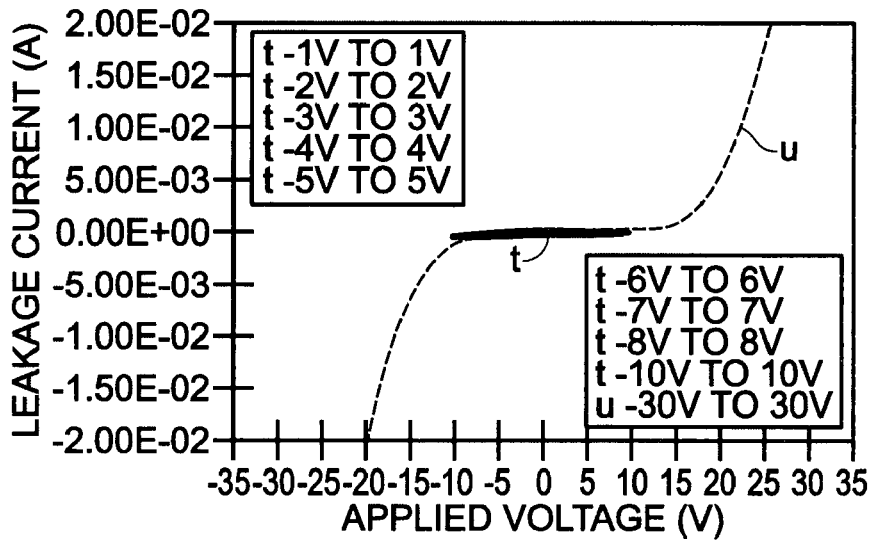
FIGS. 8A and 8B show the IV curves of MSM devices with a ZnOx thickness of about 1.1 µm and a device size of about 50 µm×50 µm.
Figure 8B:
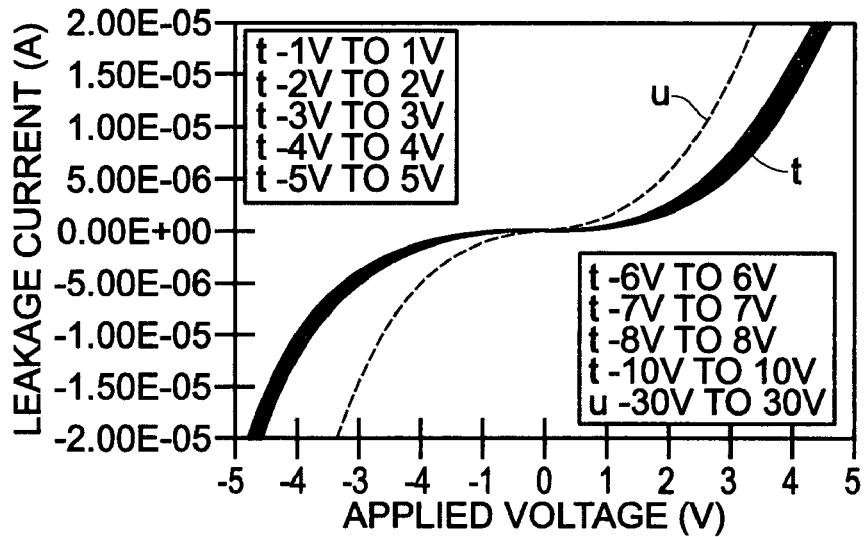

FIGS. 8A and 8B show the IV curves of MSM devices with a ZnOx thickness of about 1.1 µm and a device size of about 50 µm×50 µm. With a thicker ZnOx film, the threshold voltage increases to about 16 volts and the breakdown voltage also increases. The current also decreases, which means that the resistance of the MSM device increases significantly. In order to measure the stability of the ZnOx MSM devices, the ZnO MSM devices are annealed at about 400° C., successively in forming gas and oxygen for about 30 minutes. After forming gas annealing, the resistance of the MSM device decreases, and some thinner ZnOx MSM devices exhibit shorting. After oxygen annealing, the IV curves of the ZnOx MSM show almost no change.

FIG. 9 is a flowchart illustrating a method for forming a MSM current limiter. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 provides a substrate. Step 904 forms an MSM bottom electrode overlying the substrate. Step 906 forms a ZnOx semiconductor layer overlying the MSM bottom electrode, where x is in the range between about 1 and about 2, inclusive. Step 906 can be performed using any of the following deposition methods: spin-coating, direct current (DC) sputtering, radio frequency (RF) sputtering, metalorganic chemical vapor deposition (MOCVD), or atomic layer deposition (ALD). The ZnOx layer may have a thickness in the range of about 10 to 1000 nanometers. Step 908 forms an MSM top electrode overlying the semiconductor layer. Forming the MSM top and bottom electrodes (Steps 908 and 904) may include forming electrodes having a thickness in the range of about 30 to 200 nanometers (nm).

In one aspect, Step 906 prepares a ZnOx precursor prior to spin-coating the ZnOx, as follows: preparing a solution of 2-methyloxyethanol and ethanolamine; dissolving zinc acetate dehydrate in the solution, for example, forming about a 1:1 molar ratio of zinc to ethanolamine in the precursor; refluxing the solution at a temperature in the range of about 110 to 150° C., for a time duration in the range of about 20 to 60 minutes; and, filtering the solution to remove particles larger than about 0.2 micrometers.

In another aspect, Step 906 forms a ZnOx layer having a C-axis orientation. For example, in response to the spin-coat deposition, the ZnOx layer is formed with the C-axis orientation in response to the ethanolamine in the precursor.

In another aspect, spin-coating ZnOx overlying the MSM bottom electrode in Step 906 includes substeps. Step 906a spin-coats a ZnOx film at a spin-rate in the range of about 1000 to 4000 revolutions per minute (RPM). Step 906b bakes the ZnOx film. Step 906c anneals the. ZnOx film in an atmosphere such as dry air, an insert gas such as $N_2$ or Ar with an oxygen partial pressure, or pure oxygen. Step 906d reiterates the process (Steps 906a through 906c) to form between about 2 and 20 ZnOx layers, inclusive.

More specifically, baking the ZnOx film in Step 906b includes: baking at about 100° C. for about one minute; then, baking at about 200° C. for about one minute; and then, baking at about 300° C. for about one minute. Annealing the ZnOx film in the oxygen ambient atmosphere (Step 906c) includes annealing at a temperature in the range of about 300 to 500° C., for time duration in the range of about 1 to 30 minutes.

If ZnOx is deposited (Step 906) using the DC sputtering process, then the target may be either Zn or ZnO. The DC sputtering is carried out in an atmosphere either with, or without, oxygen. Generally, the DC sputtering includes: using a sputtering power in the range of about 100 to 300 watts; depositing for a time duration in the range of about 1 to 60 minutes; using a deposition temperature in the range of about 20 to 300° C.; sputtering in an atmosphere including an inert gas and about 0 to 30% oxygen; and, using a deposition pressure in the range of about 2 to 10 milliTorr.

In one aspect, depositing ZnOx using the DC sputtering process includes substeps. Step 906e forms a Zn film. Step 906f anneals in an atmosphere such as dry air, an inert gas such as $N_2$ or Ar with an oxygen partial pressure, or pure oxygen. Step 906g, in response to the annealing, forms a ZnOx layer.

Alternately, Step 906h forms a ZnO film. Step 906i anneals in an atmosphere such as dry air, a pure inert gas such as $N_2$ or Ar, or an inert gas such as $N_2$ or Ar with an oxygen partial pressure. Step 906j, in response to the annealing, forms a ZnOx layer. With respect to either DC sputtering process, Step 906k, subsequent to forming a ZnOx layer, anneals at a temperature in the range between about 400 and 500° C., for a time duration in the range of about 5 to 60 minutes, in an atmosphere such as dry air or pure oxygen.

If the MOCVD or ALD deposition methods are used, generally the depositing of ZnOx includes: supplying a dimethyl zinc (DMZn) precursor; supplying an oxygen partial pressure in the range of about 10 to 90%; creating a deposition pressure in the range between about 10 mTorr and 100 mTorr; growing ZnO at a temperature in the range of about 100 to 500° C., without preheating the substrate; depositing for a time duration in the range of about 100 seconds to 1 hour; and, annealing at a temperature in the range of about 400 to 500° C. for a time duration in the range of about 5 to 60 minutes, at an oxygen partial pressure in the range of about 10 to 30%.

Figure 10:
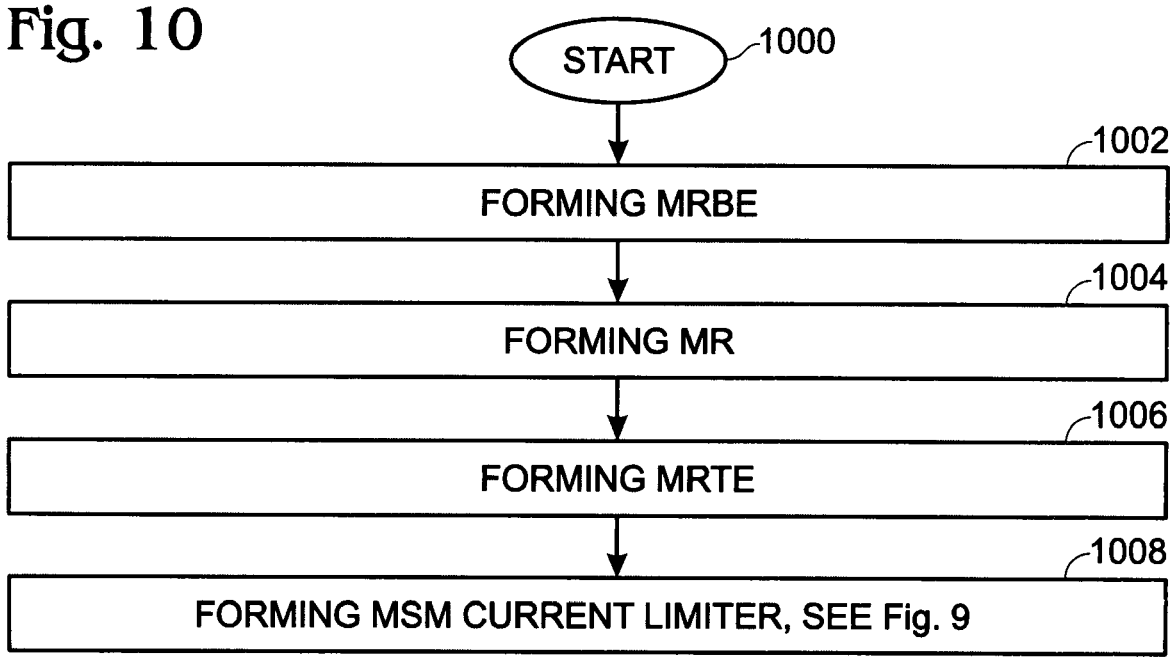
FIG. 10 is flowchart illustrating a method for forming a resistance memory device with an MSM current limiter.

FIG. 10 is flowchart illustrating a method for forming a resistance memory device with an MSM current limiter. The method starts at Step 1000. Step 1002 forms a memory resistor bottom electrode (MRBE). Step 1004 forms a memory resistor material overlying the memory resistor bottom electrode. Step 1006 forms a memory resistor top electrode overlying the memory resistor material. Step 1008 forms an MSM current limiter, where ZnOx is the semiconductor, as described above in the explanation of FIG. 9.

Forming the memory resistor material overlying the memory resistor bottom electrode in Step 1004 includes forming the memory resistor from a material such as $Pr_{0.3}Ca_{0.7}MnO_3$ (PCMO), colossal magnetoresistive (CMR) film, transition metal oxides, Mott insulators, high-temperature super conductor (HTSC), or perovskite materials.

Figure 11:
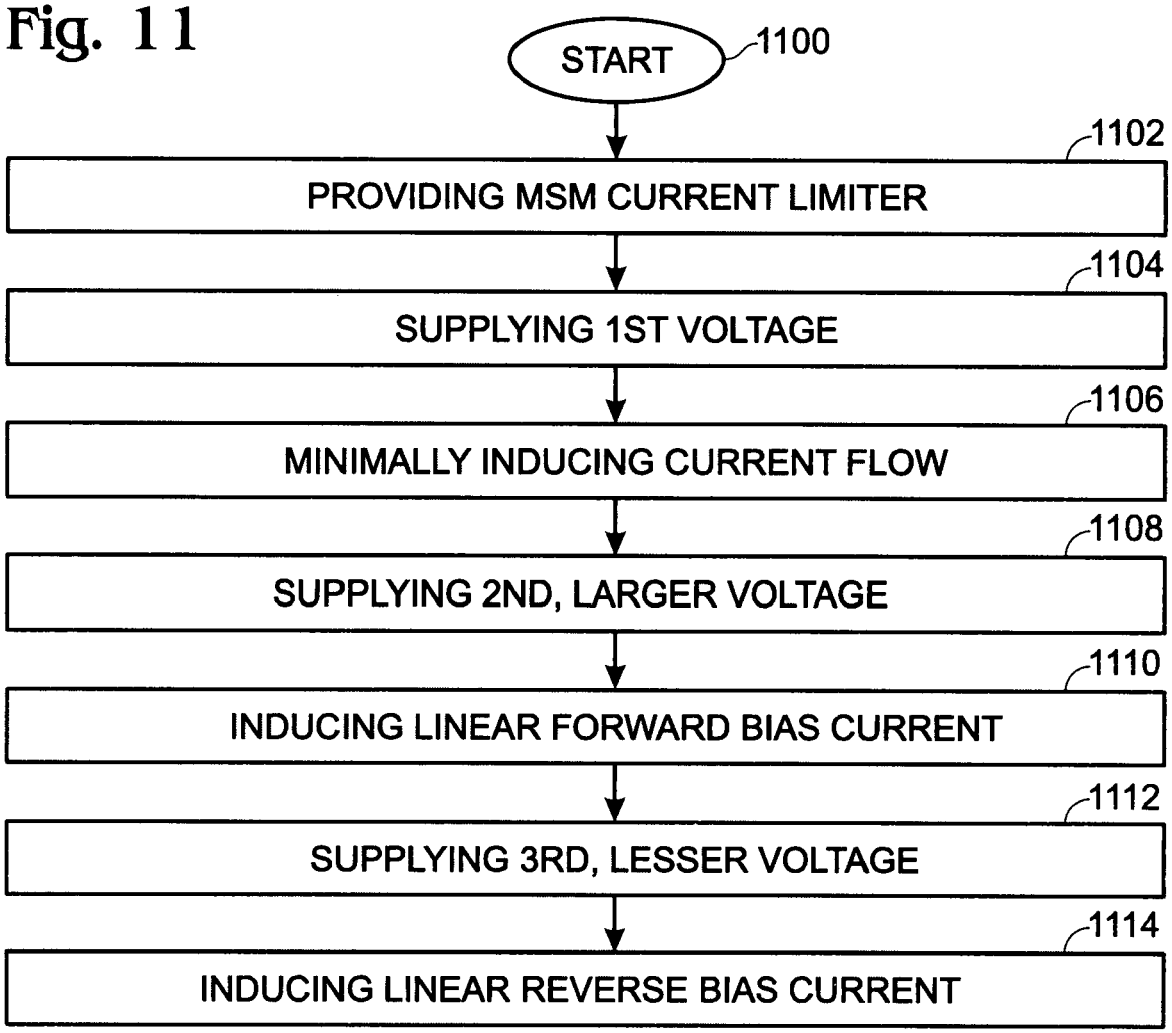
FIG. 11 is a flowchart illustrating a method for operating a MSM current limiter.

FIG. 11 is a flowchart illustrating a method for operating a MSM current limiter. The method starts at Step 1100. Step 1102 provides an MSM current limiter with a ZnOx semiconductor layer and a first terminal, where x is in the range between about 1 and about 2, inclusive, see the explanations above. Step 1104 supplies a first voltage, within a first voltage range, to the MSM current limiter terminal. In one aspect, the voltage range is centered around 0 volts. Step 1106 minimally induces a first forward bias and a non-linear first reverse bias current flow through the MSM current limiter in response to first voltage. That is, the current flow is non-linear. In Step 1106, the device performs its current limiting function, limiting forward and reverse current flow in response to relatively low forward and reverse bias voltages, respectively.

Step 1108 supplies a second voltage, greater than the first voltage (outside the first voltage range), to the MSM current limiter terminal. Then, Step 1110 induces a linear forward bias current flow through the MSM current limiter. If the forward bias voltage is increased beyond the first voltage range, the device goes into breakdown, and a more linear relationship develops between bias voltage and current.

Likewise, if Step 1112 supplies a third voltage, less than the first voltage (outside the first voltage range), to the MSM current limiter terminal, Step 1114 induces a linear reverse bias current flow through the MSM current limiter. That is, when the reverse bias voltage is decreased (made more negative) beyond the first voltage range, the device goes into breakdown, and a more linear relationship develops between bias voltage and current.

A MSM current limiter device, made with a ZnOx semiconductor, and corresponding fabrication process has been provided. Examples of process details have been presented to illustrate the invention. Likewise, a resistance memory device has been presented as an example of an application. However, the invention is not limited to merely these examples. Other variations and embodiments of the invention will occur to those skilled in the art.

We claim:

1. A resistance memory device with a metal/semiconductor/metal (MSM) current limiter, the device comprising:
   a memory resistor bottom electrode;
   a memory resistor material overlying the memory resistor bottom electrode;
   a memory resistor top electrode overlying the memory resistor material;
   an MSM bottom electrode overlying the memory resistor top electrode;
   a ZnOx semiconductor layer overlying the MSM bottom electrode, where x is in the range between about 1 and about 2, inclusive; and,
   an MSM top electrode overlying the ZnOx semiconductor layer.

2. The resistance memory device with the MSM current limiter of claim 1 wherein the memory resistor material is a material selected from the group comprising $Pr_{0.3}Ca_{0.7}MnO_3$ (PCMO), colossal magnetoresistive (CMR) film, transition metal oxides, Mott insulators, high-temperature super conductor (HTSC), and perovskite materials.

3. A metal/semiconductor/metal (MSM) current limiter, the MSM current limiter comprising:
   a substrate;
   an MSM bottom electrode overlying the substrate;
   a ZnOx semiconductor layer overlying the MSM bottom electrode, where x is in the range between about 1 and about 2, inclusive; and,
   an MSM top electrode overlying the ZnOx semiconductor layer.

4. The MSM current limiter of claim 3 wherein the ZnOx semiconductor layer has a C-axis orientation.

5. The MSM current limiter of claim 3 wherein the ZnOx semiconductor layer has a thickness in the range of about 10 to 1000 nanometers (nm).

6. The MSM current limiter of claim 3 wherein the MSM top and bottom electrodes each have a thickness in the range of about 30 to 200 nm.

7. The MSM current limiter of claim 3 wherein the MSM top and bottom electrodes are a material selected from the group comprising Pt, Ir, Au, Ag, TiN, Ti, Al, AlCu, Pd, Rh, W, Cr, and conductive oxides.

* * * * *